US012772885B2

(12) United States Patent
Nagarajan et al.

(10) Patent No.: US 12,772,885 B2
(45) Date of Patent: Oct. 20, 2026

(54) ELECTRONIC PACKAGE MOLDED VERTICAL INTERCONNECTION

(71) Applicant: Apple Inc., Cupertino, CA (US)

(72) Inventors: Kumar Nagarajan, Cupertino, CA (US); Flynn P. Carson, Redwood City, CA (US); Karthik Shanmugam, Singapore (SG); Seongmin Lee, Yeonsu-Gu (KR)

(73) Assignee: Apple Inc., Cupertino, CA (US)

( * ) Notice: Subject to any disclaimer, the term of this patent is extended or adjusted under 35 U.S.C. 154(b) by 392 days.

(21) Appl. No.: 18/469,243

(22) Filed: Sep. 18, 2023

(65) Prior Publication Data

US 2025/0096096 A1 Mar. 20, 2025

(51) Int. Cl.

| | |
|---|---|
| ***H10W 70/65*** | (2026.01) |
| ***H10W 70/685*** | (2026.01) |
| ***H10W 74/01*** | (2026.01) |
| ***H10W 74/10*** | (2026.01) |
| ***H10W 90/00*** | (2026.01) |

(52) U.S. Cl.

CPC ......... *H10W 70/65* (2026.01); *H10W 70/685* (2026.01); *H10W 74/01* (2026.01); *H10W 74/121* (2026.01); *H10W 90/00* (2026.01); *H10W 90/701* (2026.01); *H10W 90/724* (2026.01)

(58) Field of Classification Search

None

See application file for complete search history.

(56) References Cited

U.S. PATENT DOCUMENTS

| | | | |
|---|---|---|---|
| 9,589,936 | B2 | 3/2017 | Zhai et al. |
| 9,601,471 | B2 | 3/2017 | Zhai et al. |
| 9,633,974 | B2 | 4/2017 | Zhai et al. |
| 9,659,907 | B2 | 5/2017 | Zhai et al. |
| 10,181,455 | B2 | 1/2019 | Zhai et al. |
| 11,532,563 | B2 | 12/2022 | Shanmugam et al. |
| 2016/0148904 | A1 | 5/2016 | Zhai et al. |
| 2017/0092567 | A1 | 3/2017 | Vincent et al. |
| 2018/0350746 | A1 | 12/2018 | Yu et al. |
| 2022/0093522 | A1* | 3/2022 | Shanmugam ....... H01L 23/5389 |

* cited by examiner

*Primary Examiner* — Anthony Ho

(74) *Attorney, Agent, or Firm* — Aikin & Gallant, LLP

(57) ABSTRACT

Electronic packages and methods of formation are described. In an embodiment, an electronic package includes one or more electronic components encapsulated in a step molded molding compound layer, and wiring layer spanning a lower step surface, sidewall, and top surface of the step molded molding compound layer. The wiring layer may further extend into a via opening extending through the lower step surface of the molding compound layer.

22 Claims, 9 Drawing Sheets

ELECTRONIC PACKAGE MOLDED VERTICAL INTERCONNECTION

BACKGROUND

Field

Embodiments described herein relate to electronic packaging, and more specifically to multiple level electronic packages.

Background Information

Today, the electronics industry uses a lot of passive and active components as part of integrated circuits for different sub-system in many products such as touch sensing, haptics module or camera module. Due to the increasing need for miniaturizing systems they are typically packaged as system in packages (SiPs), where the components are assembled/soldered on a substrate and then encapsulated using a molding compound. This helps in placing the various components required for a system together in one place and reducing the overall size of the package.

SUMMARY

Electronic packages and methods of formation are described which include molded vertical interconnections. In an embodiment, an electronic package includes one or more electronic components encapsulated in a step molded molding compound layer including a lower step surface, a sidewall, and top surface. A via opening can be formed in the lower step surface to expose an underlying routing layer. In this manner, the molded lower step surface can reduce overall via opening height, facilitating the use of fabrication techniques such as laser drilling for via opening formation. In another embodiment, a vertical interconnect can be encapsulated within the molding compound layer, and a via opening can be formed through the molding compound layer to expose the vertical interconnect. In this manner, the vertical interconnect can reduce overall via opening height, facilitating the use of fabrication techniques such as laser drilling for via opening formation.

DETAILED DESCRIPTION

Figure 1:
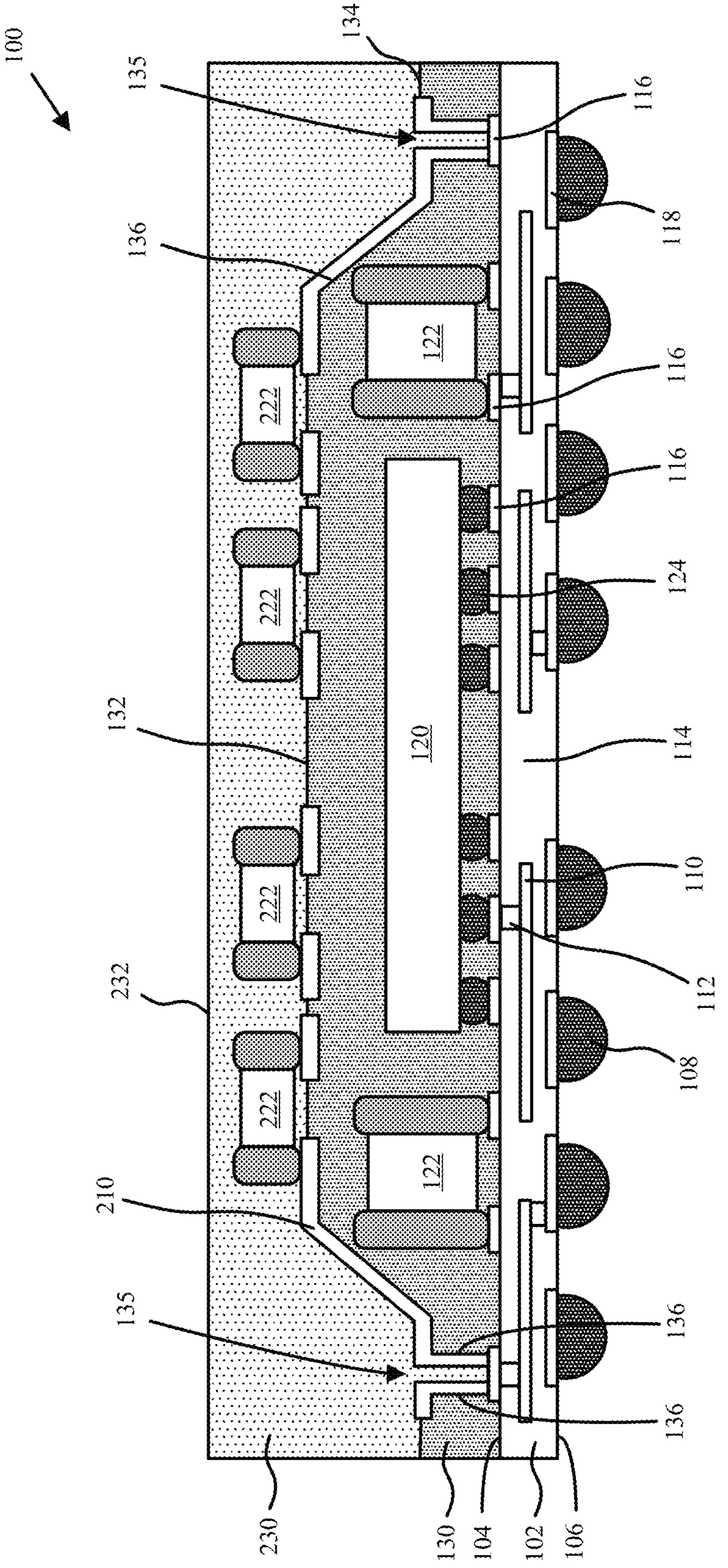
FIG. 1 is a cross-sectional side view illustration of an electronic package including a via opening extending through a lower step surface of a step molded molding compound layer in accordance with an embodiment.

Embodiments describe miniaturized system in packages (SiPs), or SiPlets, that allow vertical interconnects using laser via and specialized step molding. In an embodiment an electronic package (e.g. SiP or SiPlet) includes a first-level routing layer (e.g. package substrate), a first-level electronic component (e.g. passive device, active device, etc.) on the first-level routing layer, and a first-level molding compound layer that encapsulates the first-level electronic component on the first-level routing layer. The first-level molding compound layer in accordance with some embodiments may be step molded, and include a top surface, a lower step surface and a sidewall spanning between the top surface and the lower step surface. A second-level wiring layer can be formed on the first-level molding compound layer and spanning the lower step surface, the sidewall, and the top surface of the first-level molding compound layer. A second-level electronic component may then be mounted on the second-level wiring layer. In some embodiments, a first-level via opening extends through the lower step surface of the first-level molding compound layer to the first-level routing layer. The second-level wiring layer may additionally extend into the first-level via opening and be in electrical contact with the first-level routing layer. In this manner, the step molded first-level molding compound layer can be formed using traditional laser drilling methods, with a first-level via opening height:width ratio of 1:1 or less, with a normalized height value being 1 or less and normalized width value of 1.

In one aspect, embodiments describe herein may improve the miniaturization of SiPs by stacking passives or silicon in multiple package levels within a same SiP by multi-layer molding and wiring layer formation. Such techniques may reduce form factor and increase functionality of the SiPs from one generation to another. In some embodiments this may be facilitated by a step mold structure, in which a bottom step of the mold is used to drill a blind via that is 1:1 aspect ratio or less (i.e., wider). Then a first-level routing layer circuit connections are formed along the sidewalls of the step mold to the top of the molding compound layer using suitable techniques such as sputtering, plating and/or laser direct structuring of the molding compound layer. Electronic components, such as a passives or integrated circuit (IC) silicon, can be added to the top of the molding compound layer creating a second package level. Another step mold can then optionally be assembled on the second package level allowing further addition of another vertical layer. These operations can be repeated to form additional package levels.

In various embodiments, description is made with reference to figures. However, certain embodiments may be practiced without one or more of these specific details, or in combination with other known methods and configurations. In the following description, numerous specific details are set forth, such as specific configurations, dimensions and processes, etc., in order to provide a thorough understanding of the embodiments. In other instances, well-known semiconductor processes and manufacturing techniques have not been described in particular detail in order to not unnecessarily obscure the embodiments. Reference throughout this specification to "one embodiment" means that a particular feature, structure, configuration, or characteristic described in connection with the embodiment is included in at least one embodiment. Thus, the appearances of the phrase "in one embodiment" in various places throughout this specification are not necessarily referring to the same embodiment. Furthermore, the particular features, structures, configurations, or characteristics may be combined in any suitable manner in one or more embodiments.

The terms "over", "to", "between", "spanning" and "on" as used herein may refer to a relative position of one layer with respect to other layers. One layer "over", "spanning" or "on" another layer or bonded "to" or in "contact" with another layer may be directly in contact with the other layer or may have one or more intervening layers. One layer "between" layers may be directly in contact with the layers or may have one or more intervening layers.

Referring now to FIG. 1 a cross-sectional side view illustration is provided of an electronic package 100 including a via opening 135 extending through a lower step surface 134 of a step molded first-level molding compound layer 130 in accordance with an embodiment. In the illustrated embodiment, an electronic package 100 includes a first-level routing layer 102. For example, this can be a package substrate such as interposer, printed circuit board, etc. The first-level routing layer 102 may be rigid or flexible, and may include one or more layers. In the illustrated embodiment, the first-level routing layer 102 includes a plurality of metal routing layers 110 and insulation (e.g. dielectric) layers 114. The metal routing layers 110 may be connected with vias 112, which can be separate or integrally formed with the metal routing layers 110. A top side 104 of the first-level routing layer 102 may include a plurality of landing pads 116, and the bottom side 106 of the first-level routing layer 102 may including a plurality of bond pads 118, for example for application of solder bumps 108 for subsequent flip chip mounting of the electronic package 100.

The first-level routing layer 102 in accordance with the various embodiments described herein may assume various configurations such as redistribution layers or printed circuit boards (PCBs), each including one or more metal routing layers 110 and insulation (e.g. dielectric) layers 114. Furthermore, the first-level routing layers 102 may be rigid or flexible. The first-level routing layer 102 may be formed of a variety of materials, including traditional substrates such as FR-2 (a phenolic paper impregnated with resin), FR-4 (a woven fiberglass impregnate with resin), RCC (resin coated copper), ABF (Ajinomoto Build-up Film) metal or metal core substrates, silicon core substrates, ceramics, polymers, etc. Metal routing layers 110 and vias 112 may be formed of suitable materials, such as copper, gold, aluminum, etc. First-level routing layers may be coreless substrates, or include cores. First-level routing layers 102 can also be formed using thin film techniques. For example, the insulation layer(s) 114 may be formed of a photoimageable dielectric material including polymers (e.g. polyimide, epoxy, epoxy blends, etc.) or inorganic materials (e.g. oxide, nitride), while the metal routing layers 110 and vias 112 may be formed of a suitable metal, including copper.

In accordance with embodiments, one or more electronic components 120, 122 can be mounted onto the top side 104 of the first-level routing layer 102, for example using solder bumps 124. For example, electronic components 120 can be an active silicon device, while electronic components 122 are passive devices, such as resistors, capacitors, inductors, etc. However, this is exemplary, and a variety of electronic components can be integrated. It is to be appreciated that while the electronic components 120, 122 are mounted onto a pre-formed first-level routing layer 102, that this is not required and a first-level routing layer 102 can be subsequently formed, for example, as a redistribution layer (RDL) using an embedded wafer level packaging process.

Still referring to the embodiment illustrated in FIG. 1, a first-level molding compound layer 130 encapsulates the one or more first-level electronic components 120, 122 on the first-level routing layer 102. When step molded, the first-level molding compound layer 130 includes a top surface 132, a lower step surface 134 and a sidewall 136 spanning between the top surface 132 and the lower step surface 134. For example, topography of the first-level molding compound layer 130 can be determined by the profile of a top mold cavity during molding.

Following the formation of the first-level molding compound layer 130 one or more via openings 135 may be formed through the lower step surface(s) 134 of the first-level molding compound layer 130 to the first-level routing layer 102, such as to landing pad(s) 116. In accordance with embodiments, the first-level via opening 135 has a height: width ratio of 1:1 or less, with the height value being 1 or less. Thus, conventional laser drilling equipment may be utilized. In an exemplary embodiment, a thickness of the first-level molding compound layer 130 between the lower step surface 134 and the first-level routing layer 102 is less than 100 μm, such as 80 μm. In order to maintain the 1:1 or less aspect ratio, a maximum width of the first-level via opening 135 between laterally opposite sidewalls 138 is thus, the same or greater distance. In the exemplary embodiment of an 80 μm deep via opening 135, a maximum width of the via opening 135 (for example at the top surface 134 where the via opening has straight or inwardly tapered sidewalls 138) is 80 μm or more.

In accordance with embodiments, a second-level wiring layer 210 is formed on the first-level molding compound layer 130 and spanning the lower step surface 134, the sidewall 136, and the top surface 132 of the first-level molding compound layer. The second-level wiring layer 210 can extend into the first-level via opening and be in electrical contact with the first-level routing layer. The second-level wiring layer 210 can fully or partially fill the first-level via opening 135.

The second-level wiring layer 210 may be formed using a variety of techniques, and combinations thereof, including sputtering, evaporation, plating, and laser direct structuring (LDS). Furthermore, the second-level wiring layer 210 may including a single layer or multiple layers. For example, the second-level wiring layer 210 may include a nucleation layer and bulk layer. Where LDS is used, the first-level molding compound layer 130 is a laser direct structuring (LDS) compatible material including a first dispersed non-conductive metal organic compound, while the second-level wiring layer 210 comprises metal particles of a first metal in the first dispersed non-conductive metal organic compound, which may form the entirety of the second-level wiring layer 210 or a nucleation layer onto which a bulk layer is grown, for example with plating. The second level wiring layer 210 may also be formed by applying a masking layer on top of the mold and sputter coating a layer of metal on the wiring area. Another method of applying the wiring layer would be coat the sputter layer and then laser etch the areas to form the various circuits.

The wiring layers in accordance with embodiments, inclusive of the second-level wiring layer 210 may include one or more layers and materials to form wiring traces, via connections, and landing pads. For example, the wiring layers can include copper layers, stainless steel layers, as well as plated nickel/gold or nickel/palladium/gold layers for landing pad formation.

Still referring to FIG. 1, one or more second-level electronic components 222 are then mounted onto the second-level wiring layer 210 followed by encapsulation in a second level molding compound layer 230, which may optionally have a level top surface 232. However, a step molding operation may alternatively be performed to facilitate the formation of additional package levels. In some embodiments the second-level molding compound layer extends into the first-level via opening 135.

Referring now to FIGS. 2A-2D various schematic cross-sectional side view illustrations are provided for a wiring layer formed within via opening 135 in accordance with embodiments. It is to be appreciated that while the illustrations are made with regard to a first-level molding compound layer 130 and second-level wiring layer 210, that this is merely exemplary and can be applicable to other package levels.

Figure 2A:
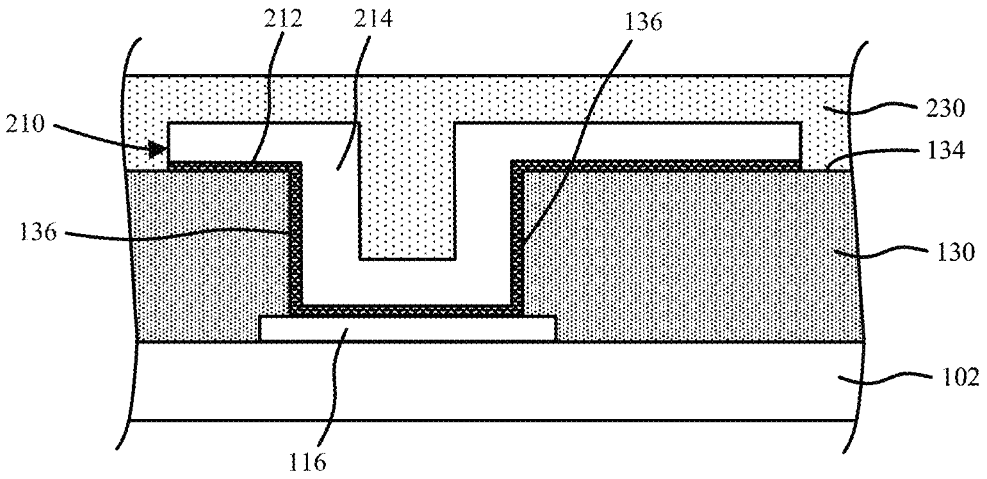
FIGS. 2A-2B are cross-sectional side view illustrations of a wiring layer deposited within a via opening in accordance with embodiments.

FIG. 2A is a cross-sectional side view illustration of a wiring layer deposited within a via opening in accordance with an embodiment. In such an embodiment, formation of wiring layer 210 may include deposition using a physical vapor deposition (PVD) technique such as sputtering or evaporation. For example, the bulk layer 214 can be deposited using such a PVD technique and/or a nucleation layer 212 can be deposited using such a PVD technique. In an embodiment, one or more bulk layers 214 is deposited, or grown, using a plating technique after deposition of the nucleation layer 212 on the first-level molding compound layer 130 and sidewalls 138.

Figure 2B:
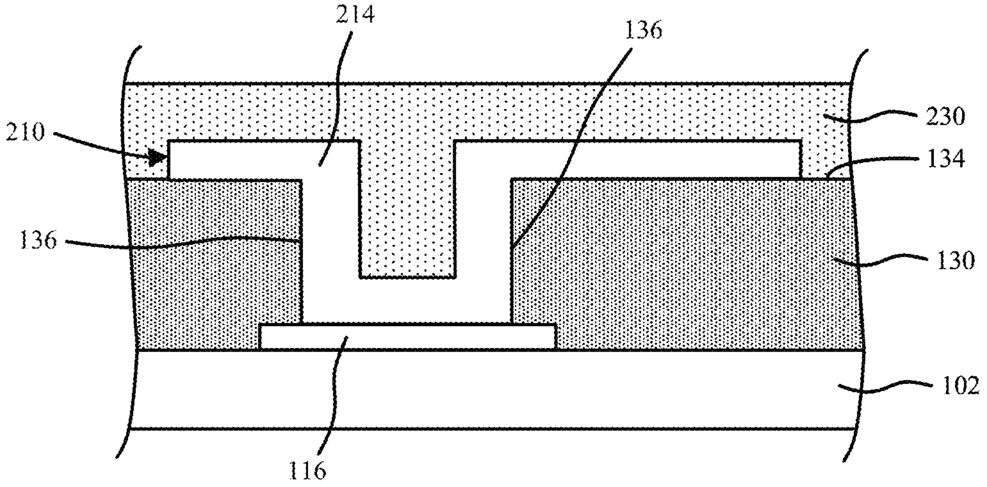

FIG. 2B is similar to FIG. 2A, without an intermediate nucleation layer. In the illustrated embodiment, the wiring layer 210 includes a bulk layer 214 formed of one or more layers which can be deposited using a PVD technique such as sputtering or evaporation. Patterning of the wiring layer may be accomplished with masking or a laser etch process for example.

Figure 2C:
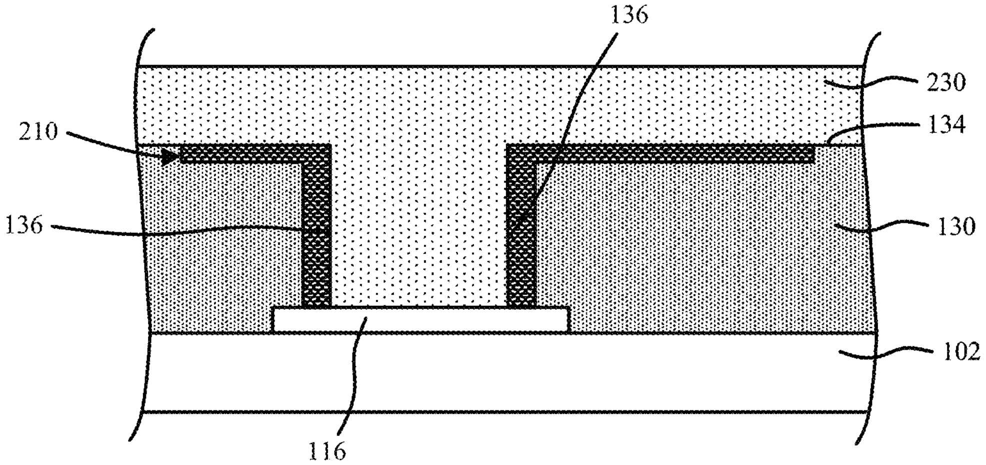
FIG. 2C is a cross-sectional side view illustration of a wiring layer formed within a via opening with laser direct structuring in accordance with an embodiment.

FIG. 2C is a cross-sectional side view illustration of a wiring layer formed within a via opening with laser direct structuring in accordance with an embodiment. The molding compounds used to encapsulate the electronic components in accordance with embodiments can be a laser direct structuring (LDS) compatible material. In this manner, LDS can be utilized to form a variety of interconnect structures through or on the molding compound layers, including vertical vias, and wiring layers (inclusive of contact pads).

Figure 2D:
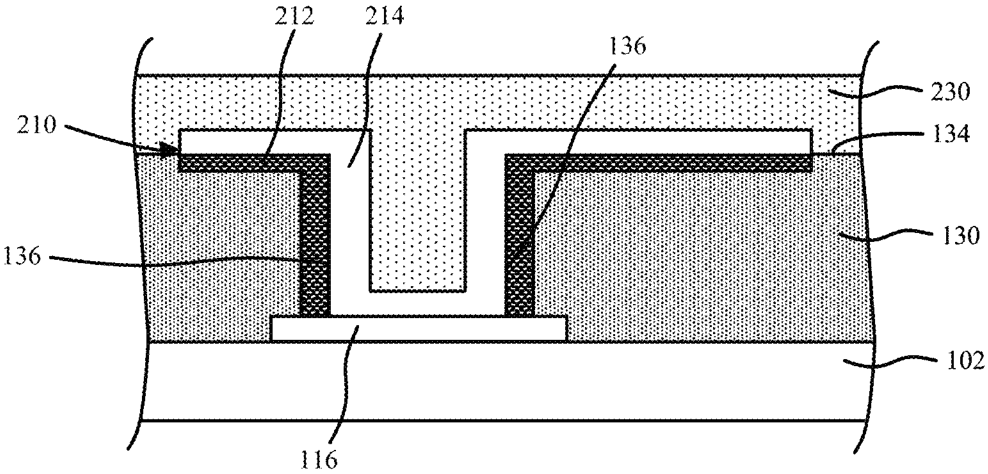
FIG. 2D is a cross-sectional side view illustration of a wiring layer formed within a via opening with a combination of laser direct structuring and plating in accordance with an embodiment.

The LDS additive, and laser parameters are selected so that upon application of the laser to the molding compound, a conducting path is formed corresponding to the laser pattern. As shown in FIG. 2C, the second-level wiring layer 210 can be formed entirely by the conductive path of nucleation particles. As shown in FIG. 2D, a bulk layer 214 can be formed over a nucleation layer 212, for example formed by laser patterning. In accordance with embodiments, this portion of the second-level wiring layer 210 may be formed within, or from a part of the first-level molding compound layer 130. Various metal layers can be formed with the electroless plating process including gold, nickel, palladium, silver, zinc, tin, etc. to form wiring traces, via connections, and landing pads.

Figure 3:
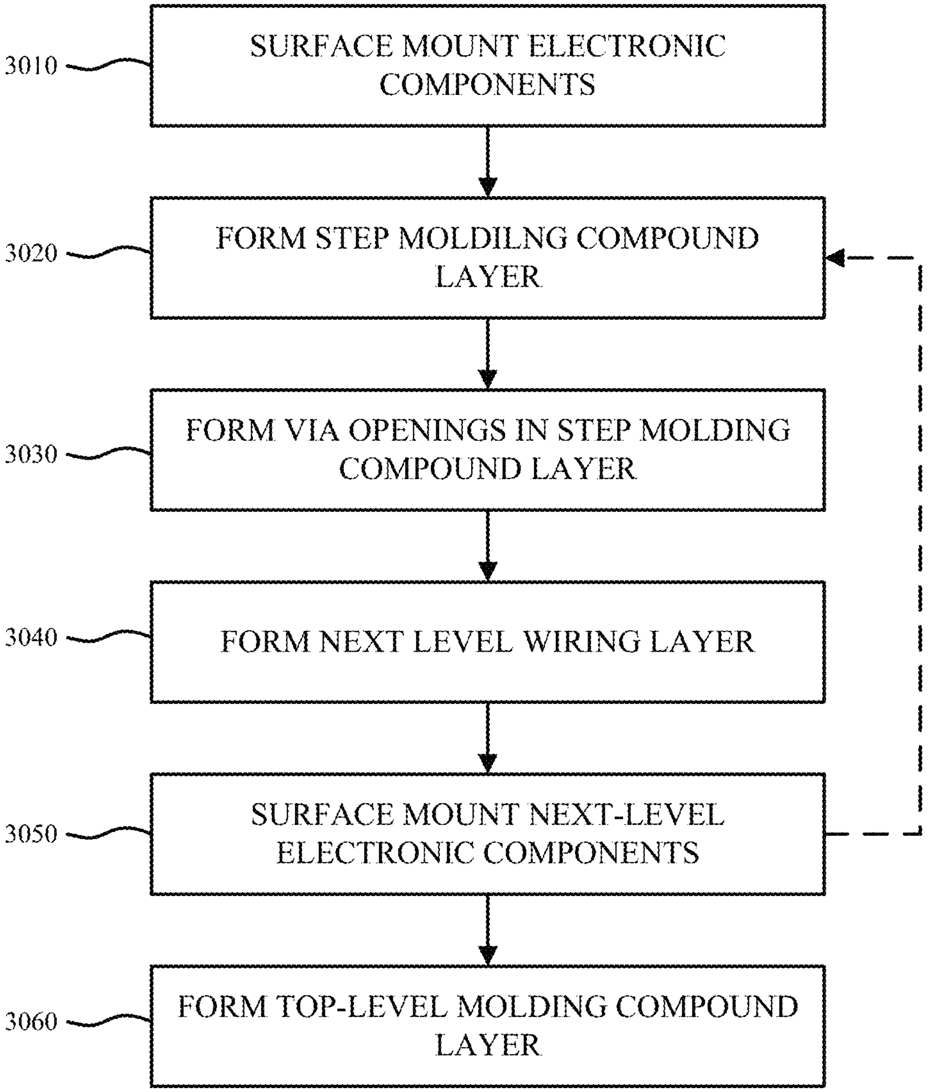
FIG. 3 is a flow diagram for a method of forming an electronic package in accordance with an embodiment.
Figure 4A:
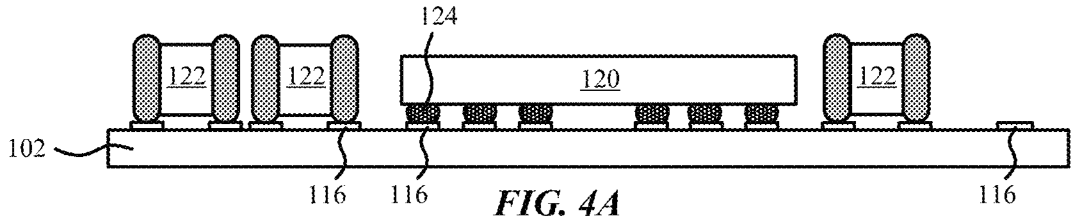
FIGS. 4A-4J are cross-sectional side view illustrations of a method of forming an electronic package in accordance with an embodiment.

Referring now to FIG. 3 and FIGS. 4A-4J, FIG. 3 is a flow diagram for a method of forming an electronic package in accordance with an embodiment, FIGS. 4A-4J are cross-sectional side view illustrations of a method of forming an electronic package in accordance with an embodiment. In interest of clarity and conciseness operations of the flow diagram of FIG. 3 are discussed concurrently with the structures illustrated in FIGS. 4A-4J. Referring now to FIG. 4A at operation 3010 one or more first-level electronic components 120, 122 are mounted on a first-level routing layer 102. For example, the first-level electronic components 120, 122 can be mounted using solder bumps 124, or other suitable manner such as conductive films, conductive pastes or with adhesive and wire bonding to make electrical contact with landing pads 116 on the top side 104 of the first-level routing layer 102.

Figure 4B:
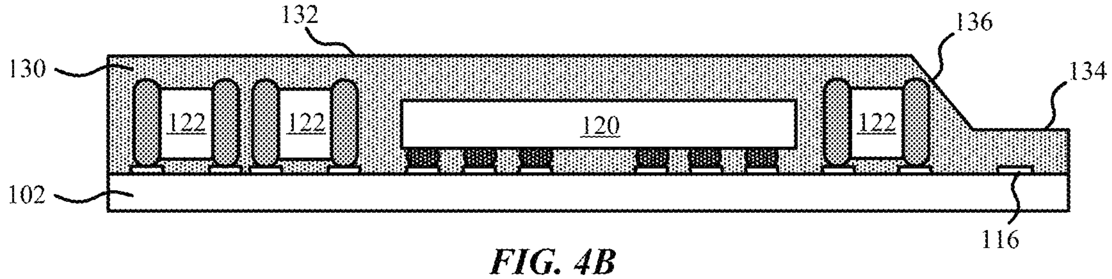
Figure 4C:
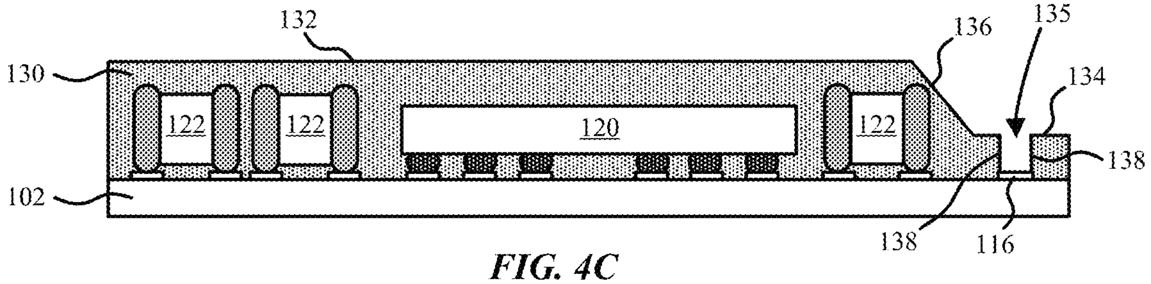

The one or more first-level electronic components 120, 122 can then be encapsulated in a first-level molding compound layer 130 at operation 3020. For example, this may be a step molding operation in which a top mold cavity has a profiled surface, resulting in a first-level molding compound layer 130 including a top surface 132, lower step surface 134 and a sidewall 136 spanning between the top surface 132 and the lower step surface 134 as shown in FIG. 4B. One or more via openings 135 can then be formed through the first-level molding compound layer 130 at operation 3030. In the particular embodiment illustrated in FIG. 4C the via openings(s) 135 are formed through the lower step surface 134 to the first-level routing layer 102, exposing landing pads 116. For example, these may be blind via opening(s) 135.

In accordance with embodiments, the via openings 135 are formed using a suitable technique such as etching or laser drilling. Exemplary laser sources include $CO_2$ lasers, Nd:YAG lasers, combinations thereof, etc. Traditional laser drilling may be accomplished with via opening diameters as low as 25 μm (~0.001 mils) with Nd:YAG lasers and 50-70 μm (~0.002-0.003 mils) with $CO_2$ lasers, for example. It has been observed that laser via opening quality can be affected when aspect ratios exceed a 1:1 aspect ratio of height:width (i.e. width/diameter being less than height). In accordance with embodiments, via openings 135 are characterized by a height:width aspect ratio of 1:1 or less, with the normalized height value being 1 or less with a normalized width value of 1. For example, a via opening with maximum width or diameter of 50-100 μm may have a corresponding maximum height of 50-100 μm or less to maintain the aspect ratio. Specifically, a via opening with maximum width of 80 μm may have a corresponding maximum height of 80 μm or less. The height thus, corresponds to the thickness of the first-level molding compound layer between the lower step surface 134 and the first-level routing layer 102. The step mold in accordance with embodiments may facilitate the integration of laser drilling while maintaining a specified aspect ratio.

Figure 4D:
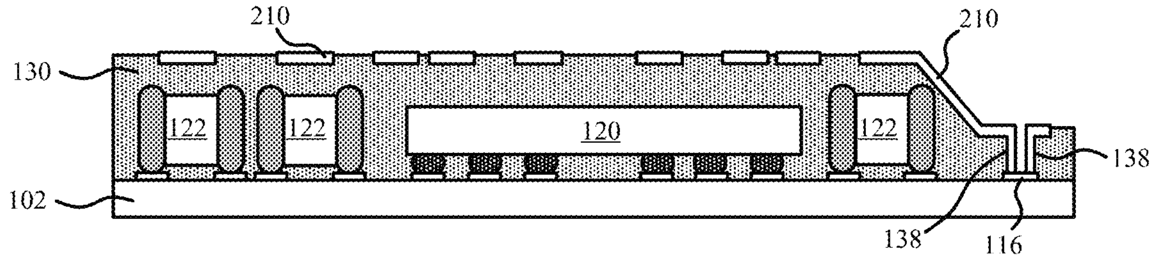

Referring now to FIG. 4D at operation 3040 a second-level wiring layer 210 is then formed on the first-level molding compound layer 130, and specifically along the lower step surface 134, the sidewall 136 and the top surface 132. Furthermore, the second-level wiring layer 210 can extend into the first-level via opening 135 and is in electrical contact with the first-level routing layer 102. The second-level wiring layer 210 can be formed using a variety of techniques, such as those described with regard to FIGS. 2A-2D. For example, sputtering or plating techniques may provide higher quality routing structures where the aspect ratio of the via openings 135 is maintained at 1:1 or less, with the normalized height value being 1 or less with a normalized width value of 1. In accordance with embodiments, the second-level wiring layer 210 may completely or partially fill the first-level via openings 135. For example, in the embodiments illustrated in FIGS. 2A-2D, the second-level wiring layer 210 may line sidewalls 138 of the via openings, and optionally the landing pad 116 exposed on the bottom surface of the via openings 135. Alternatively, via plugs may be separately formed from the second-level wiring layer 210, or the second level wiring layer 210 can completely fill the first-level via openings 135.

Figure 4E:
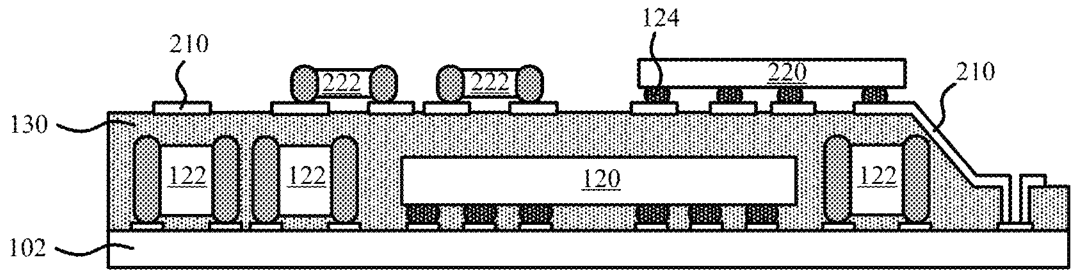
Figure 4F:
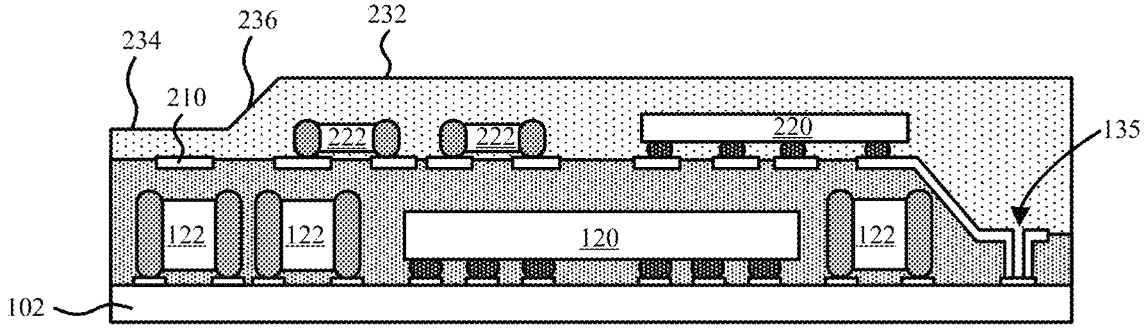

As shown in FIG. 4E, following the formation of the second-level wiring layer 210, one or more second-level electronic compounds 220, 222 can be mounted on the second-level wiring layer 210 at operation 3050. The second-level electronic components 220, 222 can be mounted in similar manner as the first-level electronic components 120, 122. Where additional package levels will not be formed a top level molding compound layer, such as second-level molding compound layer 230, can be formed at operation 3060 to encapsulate the second-level electronic components 220, 222 such as illustrated in FIG. 1. Where additional package levels are to be formed the operations 3020-3050 can be repeated to form the additional package levels. For example, referring to FIG. 4F the second-level molding compound layer 230 can also be step molded to included a second top surface 232, a second lower step surface 234 and a second sidewall 236 spanning between the second top surface and the second lower step surface. In some embodiments the second-level molding compound layer 230 extends into the first-level via opening 135.

Figure 4G:
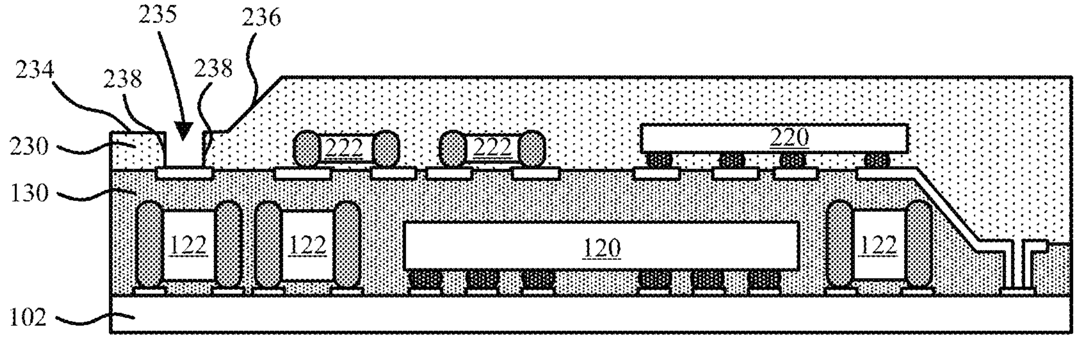
Figure 4H:
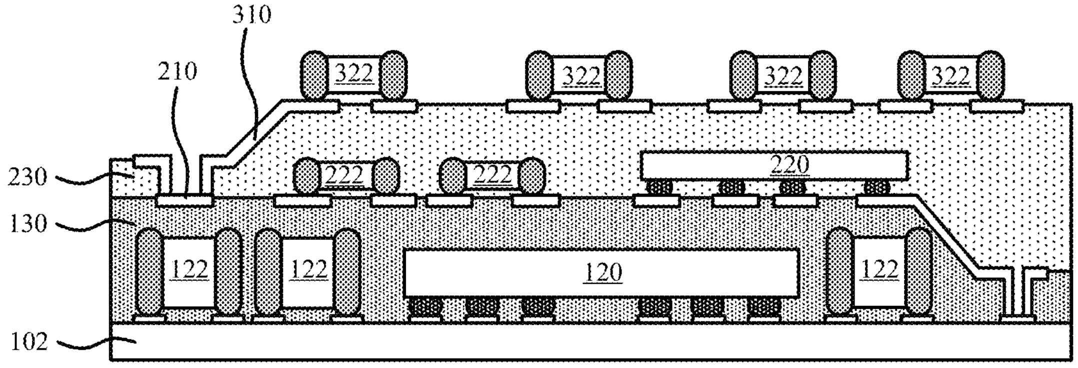
Figure 4I:
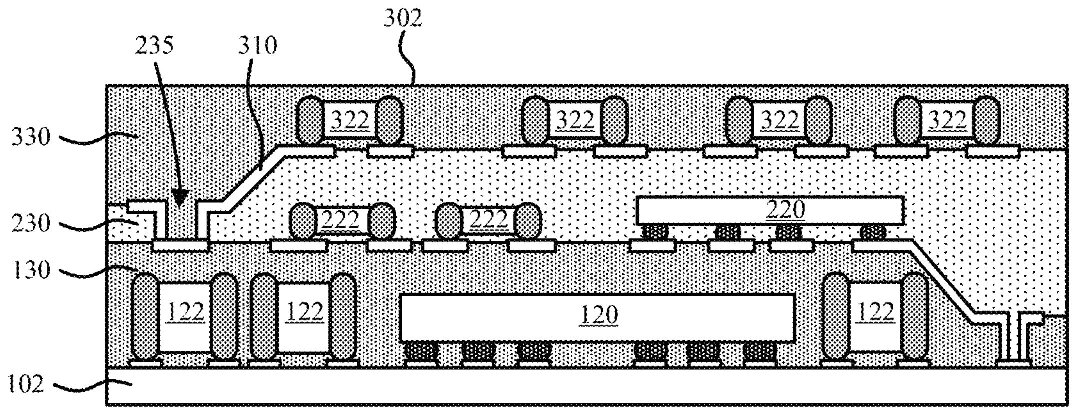
Figure 4J:
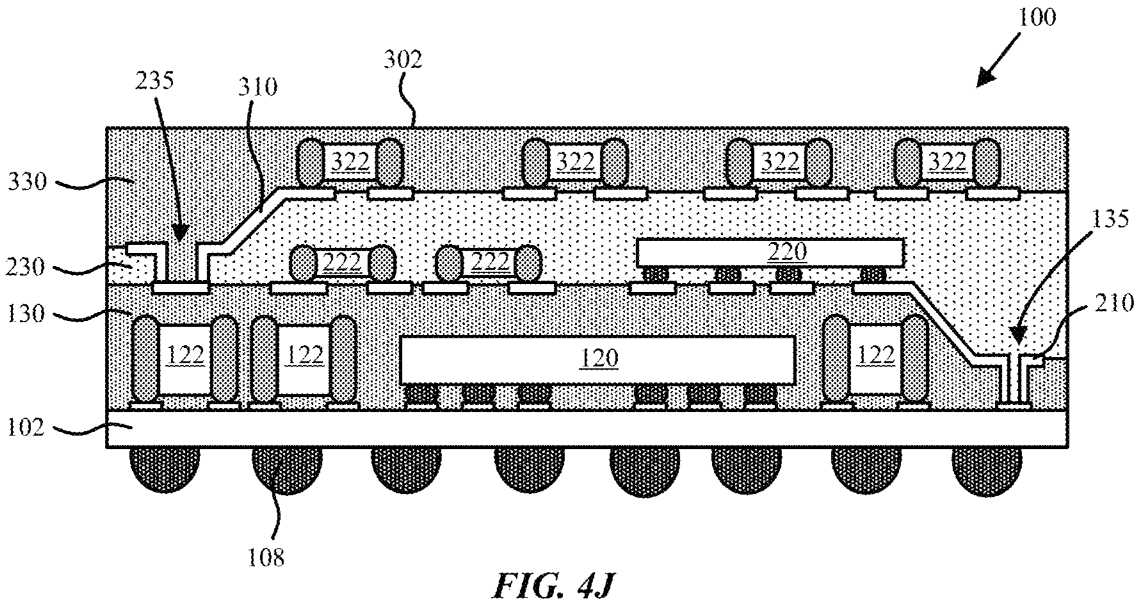

A second-level via opening 235 including sidewalls 238 may then be formed in the second-level molding compound layer 230 and extend through the second lower step surface 234 to the second-level wiring layer 210 as shown in FIG. 4G. As shown in FIG. 4H a third-level wiring layer 310 can then be formed similarly as the second-level wiring layer 210 previously described, followed by mounting of one or more components 322 similarly as electrical components 222 previously described. This sequence can be repeated until the final packaging layer. For example, in the embodiment illustrated in FIG. 4I, a third-level molding compound layer 330 with level top surface 302 is formed over the second-level wiring layer 210 and encapsulating the one or more electrical components 322. In some embodiments the third-level molding compound layer 330 extends into the second-level via opening 235. A plurality of package solder bumps 108 may then be applied to the first-level routing layer 102 as illustrated in FIG. 4J. In a panel-level or wafer-level process, a plurality of electronic packages 100 may then be singulated.

Figure 5:
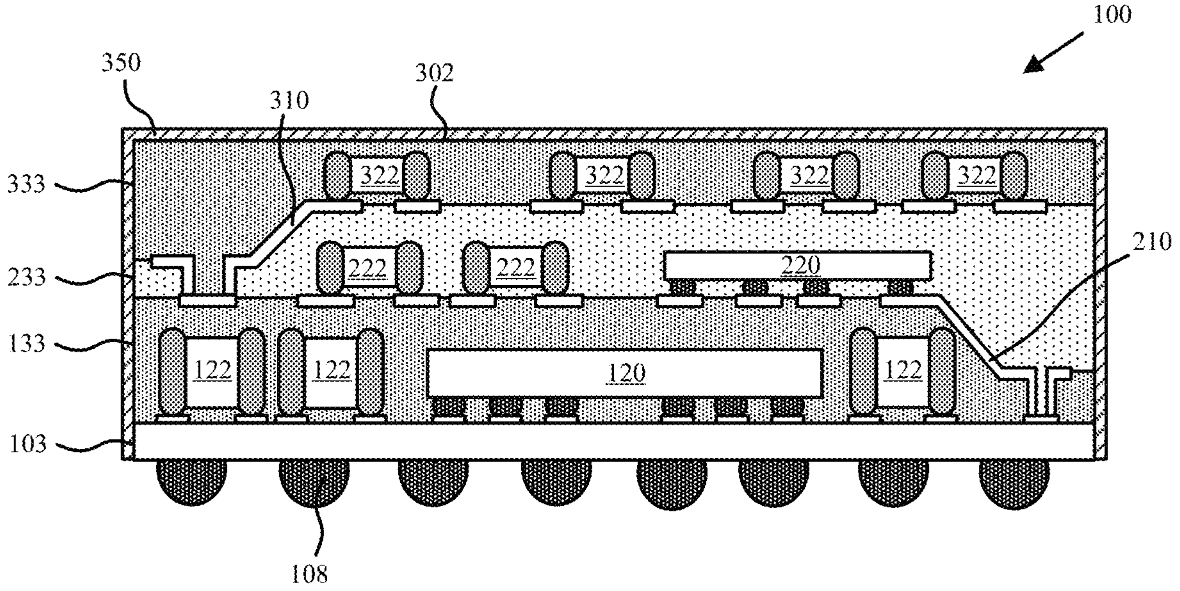
FIG. 5 is a cross-sectional side view illustration of an electronic package including an electromagnetic interference shielding layer in accordance with an embodiment.

FIG. 5 is a cross-sectional side view illustration of an electronic package 100 including an electromagnetic interference (EMI) shielding layer 350 in accordance with an embodiment. For example, the EMI shielding layer 350 can be deposited onto side surfaces 103, 133, 233, 333 of the routing layer 102, first-level molding compound layer 130, second-level molding compound layer 230, and third-level molding compound layer 330 if present, etc. as well as the top surface of the top molding compound layer, such as top surface 302. The EMI shielding layer 350 may include one or more metal layers. For example, the EMI shielding layer 350 can be formed using sputter deposition with material such as stainless steel and copper metal.

Figure 6:
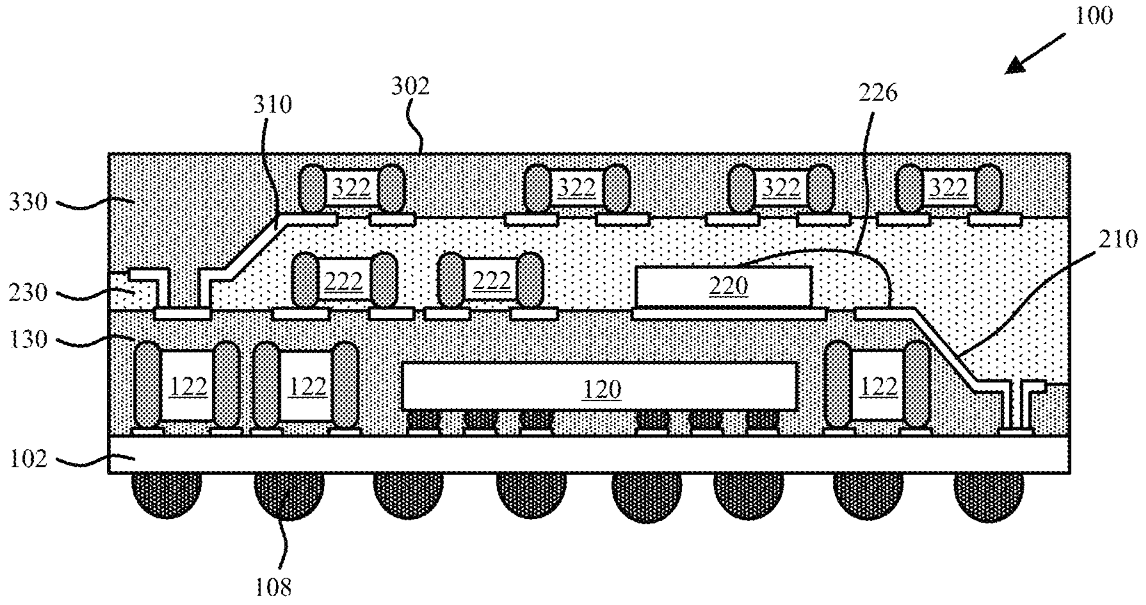
FIG. 6 is a cross-sectional side view illustration of an electronic package including multiple package levels including via openings extending through lower step surfaces of step molded molding compound layers in accordance with an embodiment.

FIG. 6 is a cross-sectional side view illustration of an electronic package 100 including multiple package levels including via openings extending through lower step surfaces of step molded molding compound layers in accordance with an embodiment. FIG. 6 is similar to the embodiment illustrated in FIG. 4J, with the variation of an electronic component 220 being bonded with underlying adhesive and wire bonds 226 for electrical connection to the second-level wiring layer 210. It is to be appreciated that wire bonding can be used for electrical connection for any electronic components in any package level.

Up until this point electronic package 100 configurations including step molded layers have been described to facilitate the inclusion of laser drilled via openings to accomplish stacking of electronic components in multiple package levels. Alternatively, laser drilled via openings can be made to expose underlying vertical interconnects, such as metal (e.g. copper) pins, metal blocks, interposers, PCB bar, etc. As such, the underlying vertical interconnect can provide the additional height to facilitate inclusion of the laser drilled via openings with specified aspect ratios.

Figure 7:
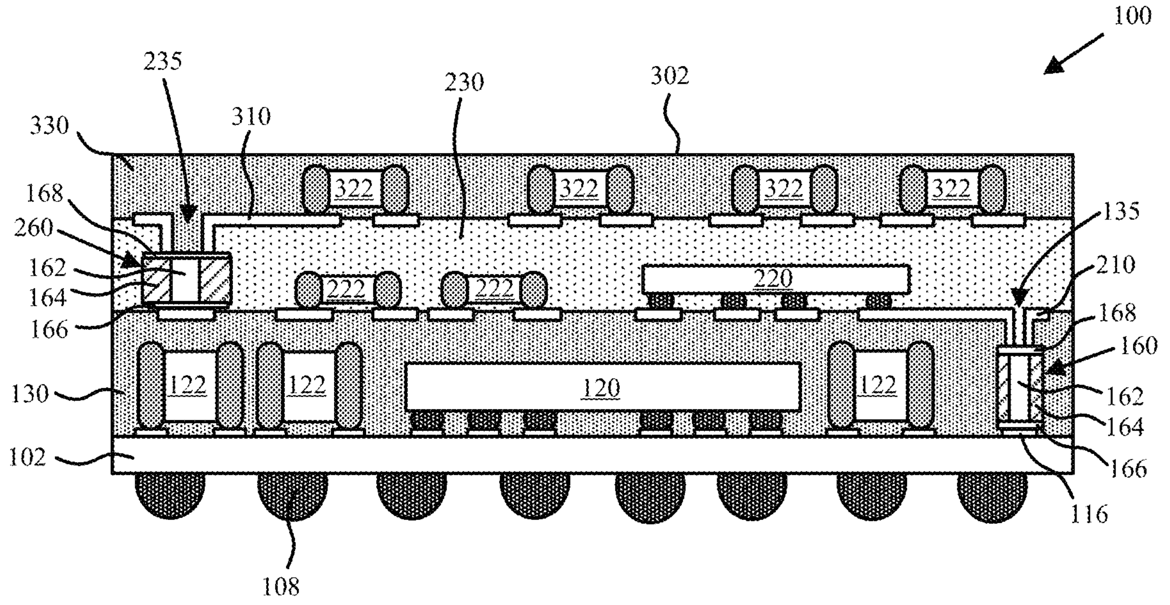
FIGS. 7-8 are cross-sectional side view illustrations of electronic packages including via openings partially extending through a thickness of a molding compound layer to an underlying vertical interconnect encapsulated by the molding compound layer in accordance with embodiments.
Figure 8:
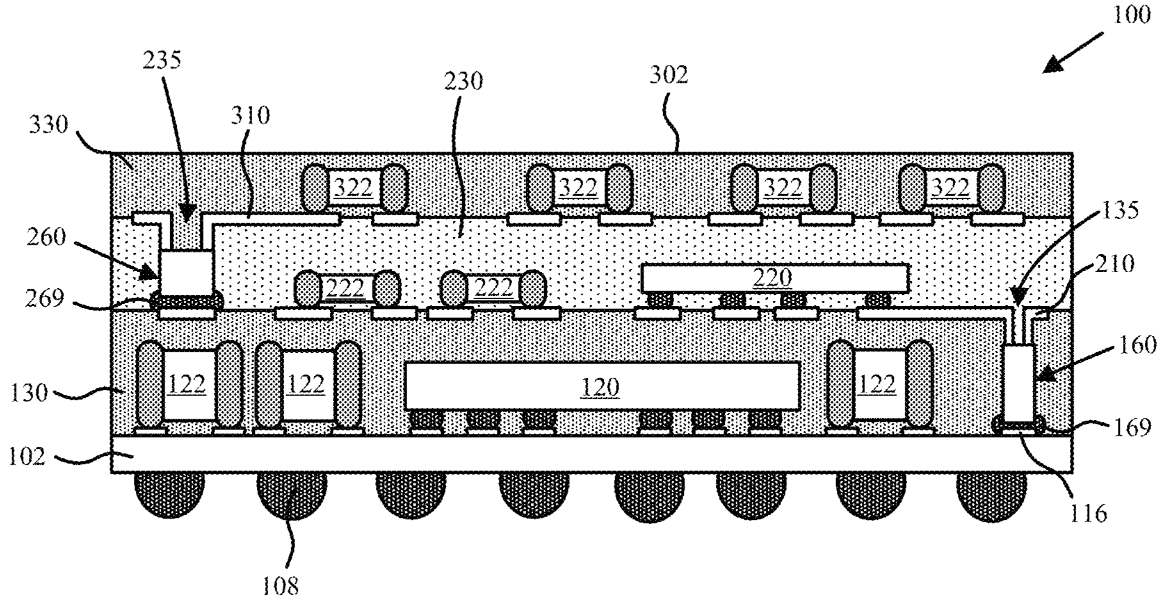

FIGS. 7-8 are cross-sectional side view illustrations of electronic packages 100 including via openings partially extending through a thickness of a molding compound layer to an underlying vertical interconnect encapsulated by the molding compound layer in accordance with embodiments. In particular, FIGS. 7-8 illustrate variations of the embodiment illustrated in FIG. 4J with step molding have been replaced with vertical interconnects 160, 260. In an embodiment, an electronic package 100 includes a first level routing layer 102, one or more first-level electronic components 120, 122 on the first-level routing layer 102, and one or more first-level vertical interconnects 160 on the first-level routing layer 102. The first-level vertical interconnects 160 can be PCB bars as shown in FIG. 7, metal (e.g. copper) pins or metal blocks as shown in FIG. 8, interposers, etc. The illustrated embodiment of FIG. 7 is exemplary of a PCB bar including a vertical via 162 shrouded by one or more dielectric layers 164, and optional top contact pad 168 and bottom contact pad 166. In an embodiment, the first-level vertical interconnects 160 can be mounted similarly as the electronic components 120, 122, such as with solder bumps 124.

As illustrated a first-level molding compound layer 130 encapsulates the one or more first-level electronic components and the one or more first-level vertical interconnects 160 on the first-level routing layer 102. Similar to previous embodiments, the first-level molding compound layer 130 can include a top surface 302 which can be a level top surface, though the first-level molding compound layer may not be step molded. Following the formation of the first-level molding compound layer 130, one or more first-level via openings are formed partially through the first-level molding compound layer 130 to the one or more first-level vertical interconnects 160, such as to the top contact pads 168.

A second-level wiring layer 210 may be formed on the top surface 132 of the first-level molding compound layer 130 and within the first-level via opening 135 as previously described. Specifically, the second-level wiring layer 210 may be in electrical contact with the first-level routing layer 102 through the first-level vertical interconnect 160. This sequence can be repeated for additional package levels, including mounting of one or more second-level electronic components 220, 222 and second level vertical interconnects 260 on the second-level wiring layer 210, followed by formation of the second-level molding compound layer 230, second-level via opening 235 formation, and formation of a third-level wiring layer 310 as previously described. The via openings may have similar height:width ratios as previously described. In the illustrated embodiment, one or more third-level electronic components 322 are mounted on the third-level wiring layer 310, followed by encapsulation with a third-level molding compound layer 330 with level top surface 302.

The illustrated embodiment of FIG. 8 is similar to that of FIG. 7, in which instead of PCB bars, the vertical interconnects 160 may be metal pins or blocks. Also shown, the metal pins or blocks may optionally be bonded to underlying landing pads or wiring layers with a bonding material 169, 269 such as solder bumps or reflowed portion of the metal pin or block such as with wire bonding.

It is to be appreciated that while the illustrated embodiments have assumed mounting of the first-level electronic components onto an existing first-level routing layer 102, that such as fabrication sequence is not strictly required, and instead the first-level electronic components can be mounted onto a carrier substrate that is subsequently removed after formation of the top molding compound layer, followed by the formation of the first-level routing layer 102.

In utilizing the various aspects of the embodiments, it would become apparent to one skilled in the art that combinations or variations of the above embodiments are possible for miniaturization of electronic packages (e.g. SiPs) by stacking passives or silicon in multiple package levels within a same electronic package. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. An electronic package comprising:

a first-level routing layer;

a first-level electronic component on the first-level routing layer;

a first-level molding compound layer that encapsulates the first-level electronic component on the first-level routing layer, the first-level molding compound layer including a top surface, a lower step surface and a sidewall spanning between the top surface and the lower step surface;

a first-level via opening extending through the lower step surface of the first-level molding compound layer to the first-level routing layer;

a second-level wiring layer on the first-level molding compound layer and spanning the lower step surface, the sidewall, and the top surface of the first-level molding compound layer; and a second-level electronic component mounted on the second-level wiring layer.

2. The electronic package of claim 1, wherein the second-level wiring layer extends into the first-level via opening and is in electrical contact with the first-level routing layer.

3. The electronic package of claim 2, wherein the second-level wiring layer includes a nucleation layer and a bulk layer on the nucleation layer.

4. The electronic package of claim 2, wherein the second-level wiring layer includes a bulk layer.

5. The electronic package of claim 2, wherein:

the first-level molding compound layer is a laser direct structuring (LDS) compatible material including a first dispersed non-conductive metal organic compound; and the second-level wiring layer comprises a nucleation layer including metal particles of a first metal in the first dispersed non-conductive metal organic compound.

6. The electronic package of claim 1, wherein the first-level via opening has a height:width ratio of 1:1 or less, with a normalized height value being 1 or less and normalized maximum width value of 1.

7. The electronic package of claim 6, wherein the first-level via opening has a maximum width of 50-100 μm.

8. The electronic package of claim 1, further comprising a second-level molding compound layer that encapsulates the second-level electronic component on the second-level wiring layer, wherein the second-level molding compound layer extends into the first-level via opening.

9. The electronic package of claim 8, wherein the second-level molding compound layer includes a second top surface, a second lower step surface and a second sidewall spanning between the second top surface and the second lower step surface.

10. The electronic package of claim 9, further comprising a second-level via opening extending through the second lower step surface of the second-level molding compound layer to the second-level wiring layer.

11. The electronic package of claim 10, further comprising a third-level wiring layer on the second-level molding compound layer and spanning the second lower step surface, the second sidewall, and the second top surface of the second-level molding compound layer.

12. The electronic package of claim 11, wherein the third-level wiring layer extends into the second-level via opening and is in electrical contact with the second-level wiring layer.

13. A method of forming an electronic package comprising:

mounting a first-level electronic component on a first-level routing layer;

encapsulating the first-level electronic component on the first-level routing layer with a first-level molding compound layer including a top surface, a lower step surface and a sidewall spanning between the top surface and the lower step surface;

laser drilling a first-level via opening through the lower step surface of the first-level molding compound layer to the first-level routing layer;

forming a second-level wiring layer on the lower step surface, the sidewall, and the top surface of the first-level molding compound layer; and mounting a second-level electronic component mounted on the second-level wiring layer.

14. The method of claim 13, wherein the first-level via opening has a height:width ratio of 1:1 or less, with a normalized height value being 1 or less and normalized maximum width value of 1.

15. The method of claim 14, wherein forming the second-level wiring layer comprises laser direct structuring.

16. The method of claim 14, wherein forming the second-level wiring layer comprises sputtering or plating.

17. The method of claim 14, wherein forming the second-level wiring layer comprises sputtering and patterning with masking or laser etch.

18. An electronic package comprising:

a first-level routing layer;

a first-level electronic component on the first-level routing layer;

a vertical interconnect on the first-level routing layer;

a first-level molding compound layer that encapsulates the first-level electronic component and the vertical interconnect on the first-level routing layer, the first-level molding compound layer including a top surface;

a first-level via opening extending through the top surface of the first-level molding compound layer to the vertical interconnect;

a second-level wiring layer on the top surface of the first-level molding compound layer, within the first-level via opening and in electrical contact with the first-level routing layer through the vertical interconnect; and a second-level electronic component mounted on the second-level wiring layer.

19. The electronic package of claim 18, wherein the first-level via opening has a height:width ratio of 1:1 or less, with a normalized height value being 1 or less and normalized maximum width value of 1.

20. The electronic package of claim 19, wherein the first-level via opening has a maximum width of 50-100 μm.

21. The electronic package of claim 18, wherein the vertical interconnect comprises a printed circuit board (PCB) bar.

22. The electronic package of claim 18, wherein the vertical interconnect comprises a metal pin or block.

* * * * *